US011385678B2

(12) United States Patent
Sakurai et al.

(10) Patent No.: US 11,385,678 B2
(45) Date of Patent: Jul. 12, 2022

(54) DISPLAY DEVICE AND TELEVISION DEVICE

(71) Applicant: AGC Inc., Chiyoda-ku (JP)

(72) Inventors: Kento Sakurai, Tokyo (JP); Jun Akiyama, Tokyo (JP); Shinya Tahara, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 286 days.

(21) Appl. No.: 16/839,166

(22) Filed: Apr. 3, 2020

(65) Prior Publication Data

US 2020/0233455 A1 Jul. 23, 2020

Related U.S. Application Data

(63) Continuation of application No. PCT/JP2018/037117, filed on Oct. 3, 2018.

(30) Foreign Application Priority Data

Oct. 4, 2017 (JP) .............................. JP2017-194638

(51) Int. Cl.
  *G06F 1/16* (2006.01)
  *G10K 9/08* (2006.01)
  (Continued)

(52) U.S. Cl.
  CPC .............. *G06F 1/1605* (2013.01); *G10K 9/08* (2013.01); *H01L 27/3225* (2013.01); *H04R 7/04* (2013.01); *G06F 3/16* (2013.01)

(58) Field of Classification Search
  CPC .......... G06F 1/1605; G06F 3/16; G06F 1/182; G10K 9/08; H01L 27/3225;
  (Continued)

(56) References Cited

U.S. PATENT DOCUMENTS 3,796,088 A * 3/1974 Gustafsson ............ G01N 11/16
  73/54.25
8,416,181 B2 * 4/2013 Yamashita ............. G09G 3/342
  345/102
(Continued)

FOREIGN PATENT DOCUMENTS

JP    05-227590 A      9/1993
JP    05227590 A   *  9/1993
(Continued)

OTHER PUBLICATIONS

International Search Report dated Dec. 25, 2018 in PCT/JP2018/037117 filed on Oct. 3, 2018 (with English Translation), 5 pages.
(Continued)

*Primary Examiner* — Akelaw Teshale
(74) *Attorney, Agent, or Firm* — Oblon, McClelland, Maier & Neustadt, L.L.P.

(57) ABSTRACT

The present invention provides a display device and a television device with which it is possible to reduce the thickness of the device profile while also realizing desirable acoustic characteristics. This display device includes: a first plate-shaped object; a display module including a display element and a second plate-shaped object that supports the display element, the display module being disposed so as to face the first plate-shaped object; a liquid layer formed by sealing up a liquid between the first plate-like object and the display module; and a vibrator provided to the first plate-shaped object and/or the display module. The loss coefficient of the display device at 25° C. is $1 \times 10^{-2}$ or greater and a thickness ratio between the first plate-shaped object and the display module is from 1:10 to 10:1.

8 Claims, 7 Drawing Sheets

(51) Int. Cl.
  *H01L 27/32* (2006.01)
  *H04R 7/04* (2006.01)
  *G06F 3/16* (2006.01)

(58) Field of Classification Search
  CPC ....... H01L 51/0096; H01L 51/50; H04R 7/04; H04R 7/045; H04R 2440/01; H04R 2499/11; H04R 2499/15; G09F 9/00; G09F 9/30; H04N 5/64; H05B 33/02
  See application file for complete search history.

(56) References Cited

U.S. PATENT DOCUMENTS

| | | | | |
|---|---|---|---|---|
| 2001/0043714 | A1* | 11/2001 | Asada | H04R 5/02 381/399 |
| 2005/0002537 | A1* | 1/2005 | Azima | H04R 7/045 381/333 |
| 2007/0228893 | A1* | 10/2007 | Yamauchi | H04R 17/00 310/348 |
| 2011/0026271 | A1* | 2/2011 | Doo | G02B 3/005 428/141 |
| 2012/0034954 | A1* | 2/2012 | Tabe | H04M 1/6083 455/566 |
| 2015/0192824 | A1* | 7/2015 | Hirota | G02B 6/0088 348/725 |
| 2015/0195657 | A1* | 7/2015 | Ishihara | B06B 1/0644 381/162 |
| 2017/0303423 | A1 | 10/2017 | Cavallaro et al. | |
| 2018/0332406 | A1* | 11/2018 | Park | H04R 23/02 |
| 2020/0059733 | A1* | 2/2020 | Shin | H04R 17/00 |
| 2021/0173487 | A1* | 6/2021 | Ham | H04R 1/028 |

FOREIGN PATENT DOCUMENTS

| | | | |
|---|---|---|---|
| JP | 2005-190683 | A | 7/2005 |
| JP | 2009-100223 | A | 5/2009 |
| JP | 2009100223 | A * | 5/2009 |
| JP | 2017-191319 | A | 10/2017 |

OTHER PUBLICATIONS

Mal, et al., "A Novel Glass Laminated Structure for Flat Panel Loudspeakers", AES Convention 124, 7343, 2008, 6 pages.

* cited by examiner

VIEWING DIRECTION

VIEWING DIRECTION

FIG. 7

| | | DISPLAY MODULE | | | | |
|---|---|---|---|---|---|---|
| | PLATE THICKNESS (mm) | 0.2 | 0.5 | 0.7 | 2.0 | 3.0 |
| FIRST PLATE-SHAPED OBJECT | 0.2 | ○ | ○ | ○ | △ | × |
| | 0.5 | ○ | ○ | ○ | ○ | △ |
| | 0.7 | ○ | ○ | ○ | ○ | ○ |
| | 2.0 | △ | ○ | ○ | ○ | ○ |
| | 3.0 | × | △ | ○ | ○ | ○ |

<EVALUATION>  ○: GOOD    △: FAIR    ×: POOR

DISPLAY DEVICE AND TELEVISION DEVICE

TECHNICAL FIELD

The present invention relates to a display device and a television device which have satisfactory acoustic performance.

BACKGROUND ART

A cone paper or resin has been generally used as a diaphragm for loudspeakers or microphones. Such a material has a high loss coefficient, vibration due to resonance hardly occurs therein, and thus, is thought to have good sound reproduction performance in the audible range.

However, since the acoustic velocity is low in any of these materials, when a high frequency causes the material excitation, vibration of the material is less likely to follow the acoustic wave frequency, and divided vibration readily occurs. It is therefore difficult to output a desired sound pressure particularly in a high-frequency range.

In recent years, the range required to be reproduced for a high-resolution sound source, etc. is a high-frequency region of 20 kHz or more. This region is a range supposed to be poorly audible by human ear, but it is preferred that the sonic vibration in the range above can be reproduced with high fidelity, because it provides a stronger emotional impact to a listener, for example, it makes the listener feel a strong realistic sensation.

Accordingly, it may be conceived that a material having a high velocity of sound propagation therethrough, such as a metal, ceramic, or glass, is used in place of the cone paper or resin.

CITATION LIST

Patent Literature

Patent Document 1: JP-A-5-227590

Non-Patent Literature

Non-Patent Document 1: Olivier Mal et. al., "A Novel Glass Laminated Structure for Flat Panel Loudspeakers", AES Convention 124, 7343.

SUMMARY OF INVENTION

Technical Problem

Known as diaphragms for loudspeakers are a diaphragm including one glass sheet (Patent Document 1) and a laminated glass having a butyral-based resin layer between two glass sheets (Non-Patent Document 1).

Nowadays, arrangement of loudspeakers in display devices such as television devices is becoming more difficult due to the trend of thinner device. The following have been proposed to address the problem: (1) to install a loudspeaker outside a display device and (2) to utilize a glass of a display device as an acoustic member by directly vibrating the glass.

However, proposal (1) has a problem in that a space, a wiring space, a power source dedicated to the loudspeaker, etc. are separately required outside the display device. Regarding proposal (2), although sounds can be produced by vibrating the glass, it is concerned that control of vibration modes is insufficient, inhibition of the glass from resonating is difficult, and hence improvements in the performance of the glass as an acoustic member would be difficult.

Accordingly, an object of the present invention is to provide a display device and a television device which render preferred acoustic characteristics possible and can be adopted to thinner devices.

Solution to Problem

[1] The display device of the present invention includes a first plate-shaped object, a display module including a display element and a second plate-shaped object that supports the display element, and the display module being disposed so as to face the first plate-shaped object, a liquid layer formed by sealing up a liquid between the first plate-shaped object and the display module, and a vibrator provided to the first plate-shaped object and/or the display module, in which the display device has a loss coefficient at 25° C. of $1 \times 10^2$ or higher, and a thickness ratio between the first plate-shaped object and the display module is from 1:10 to 10:1.

[2] The display device according to [1], in which at least one of the first plate-shaped object and the second plate-shaped object is composed of a glass sheet.

[3] The display device according to [1] or [2], in which the display element is an OLED.

[4] The display device according to any one of [1] to [3] including a first resin layer that is disposed on at least one surface of the display module.

[5] The display device according to any one of [1] to [4] including a second resin layer that is disposed on at least one surface of the first plate-shaped object.

[6] The display device according to any one of [1] to [5] including at least one resin layer that covers a side surface of the first plate-shaped object.

[7] The display device according to any one of [1] to [6], in which a mass ratio between the first plate-shaped object and the display module is from 1:10 to 10:1.

The television device of the present invention includes the display device.

Advantageous Effects of Invention

According to the display device and television device of the present invention, since the first plate-shaped object is laminated to the display module with a liquid layer interposed therebetween, control of a vibration mode is easy, and thinner devices can be made while improving the acoustic characteristics.

BRIEF DESCRIPTION OF DRAWINGS

FIG. 1A shows a first embodiment and FIG. 1B shows a second embodiment.

FIG. 2A shows a first laminating step, FIG. 2B shows a polarizing-film laminating step, FIG. 2C shows a mounting step, FIG. 2D shows an application step, and FIG. 2E shows a second laminating step.

FIG. 3A shows a first laminating step, FIG. 3B shows a polarizing-film laminating step, FIG. 3C shows an application step, FIG. 3D shows a second laminating step, and FIG. 3E shows a mounting step.

FIG. 4A shows a first laminating step, FIG. 4B shows a polarizing-film laminating step, FIG. 4C shows a second film laminating step, FIG. 4D shows an application step, FIG. 4E shows a second laminating step, and FIG. 4F shows a mounting step.

FIG. 5A shows the first embodiment including the vibrator and FIG. 5B shows the second embodiment including the vibrator.

FIG. 6A shows the first embodiment including the film and FIG. 6B shows the second embodiment including the film.

FIG. 7 is a table showing an examination of the effect of acoustic control in display devices according to the present invention.

DESCRIPTION OF EMBODIMENTS

Figure 1A:
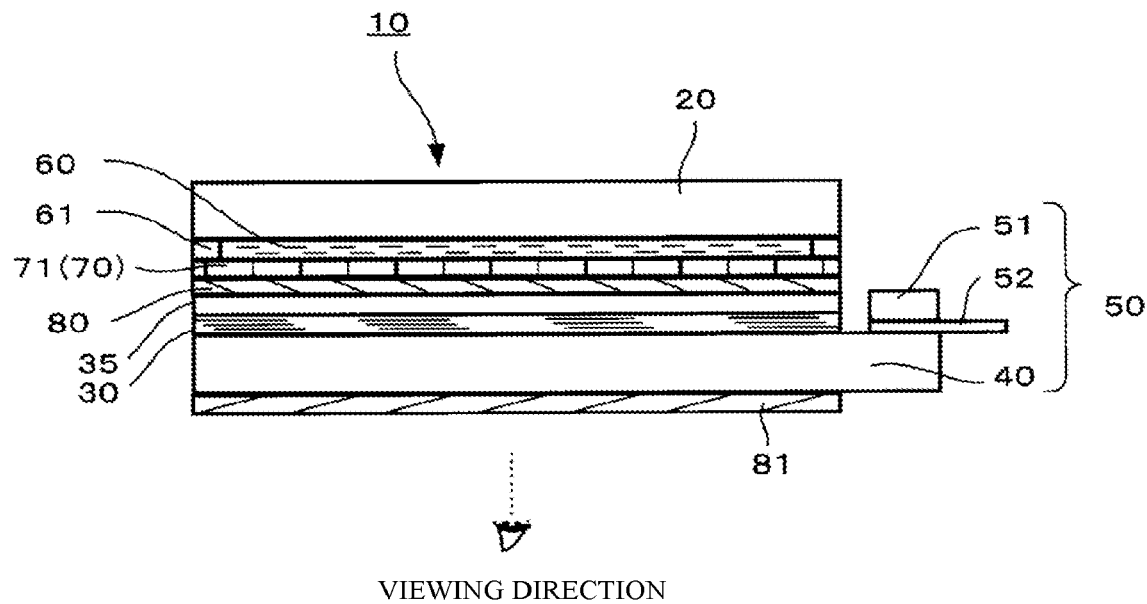
FIGS. 1A and 1B are cross-sectional views showing examples of the display device of the present invention.

Details and other features of the present invention are described below based on embodiments of the present invention. Here, in the following drawings, the same or corresponding reference numeral is assigned to the same or corresponding members or parts, and duplicated description is thereby omitted. In addition, unless otherwise specified, the drawings are not intended to show a relative ratio among members or parts. Accordingly, specific dimensions may be properly selected in the context of the following non-limiting embodiments.

Furthermore, "-" indicating a numerical range in the present description is used in the sense of including the numerical values set forth before and after the "-" as a lower limit value and an upper limit value.

(Outline of the Display Device)

The display device of the present invention includes a first plate-shaped object, a display module including a display element and a second plate-shaped object that supports the display element, and being disposed so as to face the first plate-shaped object, a liquid layer formed by sealing up a liquid between the first plate-shaped object and the display module, and a vibrator provided to the first plate-shaped object and/or the display module. The display device has a loss coefficient at 25° C. of $1 \times 10^{-2}$ or higher.

The second plate-shaped object supports an OLED (organic light-emitting diode) or the like as a display element. When the second plate-shaped object is directly vibrated, it ensures sound quality because a vibration mode is controlled by the first plate-shaped object laminated thereto. A liquid layer is disposed between the first plate-shaped object and the second plate-shaped object to maintain a given gap therebetween, thereby attaining preferred acoustic characteristics.

In one embodiment, a seal material is provided to edge portions of the first plate-shaped object in order to prevent the liquid of the liquid layer from leaking out. Furthermore, one or more resin layers is/are disposed between the first plate-shaped object and the second plate-shaped object for the purpose of shattering prevention, etc.

In the case where the display device is required to have transparency, it is preferred to include transparent plate-shaped objects, e.g., glass sheets, as the first plate-shaped object and the second plate-shaped object. Furthermore, it is useful to make the refractive indices of the liquid layer and seal material close to each other in order to increase the transmittance of the display device. Specifically, the closer the refractive indices of the liquid layer held between two plate-shaped objects and seal material, to each other, the more reflection or interference in the boundary therebetween is prevented. Such configuration is hence preferred. The boundary in this configuration does not lessen the visibility through the glass sheets. The difference in refractive index between the liquid layer and the seal material is preferably 0.015 or less, more preferably 0.01 or less.

In case where the sealed liquid layer (liquid ingredient) and the seal material are different substances having different refractive indexes and are disposed over the (whole) viewing area of the display device, then the boundary between the two is noticed due to the light transmitted from the back side and the visibility is lessened.

By reducing the difference in refractive index between the two to or below the given value, the boundary between the two can be made difficult to notice. As a result, there is no need of disposing a frame for hiding the boundary, and a frame-less display device is more easily rendered possible. It is hence possible to attain improvements in design as well as acoustic performance, improvements in design freedom, and cost reductions.

Meanwhile, in cases when the display device has a high linear transmittance, this display device can be applied as a light-transmitting member. Because of this, the display device has a visible-light transmittance, as determined in accordance with Japanese Industrial Standards (JIS R3106-1998), of preferably 60% or higher, more preferably 65% or higher, still more preferably 70% or higher. Examples of applications for the light-transmitting member include transparent loudspeakers and transparent microphones having an image display function and opening members for buildings or vehicles.

The seal material held between the two plate-shaped objects has been provided to the whole peripheries of the two plate-shaped objects. This configuration prevents the liquid layer held inside the seal material from leaking out and thereby improves the quality of the display device.

It is preferable that the edge surfaces of the two plate-shaped objects and the edge surfaces of the seal material form a single surface at each edge. Thus, since the edge surfaces of the plate-shaped objects and the edge surfaces of the seal material are flush with each other, a display device having a preferable appearance can be provided.

At least some of the edge surfaces of the periphery of at least one of the two plate-shaped objects may have a tapered surface, and an edge surface of the seal material may have a curved surface continuous with the tapered surface of the plate. Due to this configuration, sharp angles in edge portions of the plate-shaped object can be removed to attain safety, and the area of contact between the seal material and the plate-shaped object is increased, making it possible to improve the sealing performance.

It is preferable that the display device has a loss coefficient at 25° C. of $1 \times 10^{-2}$ or higher and that at least one plate-shaped object has a sheet-thickness-direction longitudinal wave acoustic velocity of $5.5 \times 10^3$ m/s or higher. Having a high loss coefficient means that the vibration damping capacity is high.

As for the loss coefficient, a value calculated by a half-width method is used. Denoting f as the resonant frequency of a material and W as a frequency width at a point decreased by −3 dB from the peak value of the amplitude h (namely, the point of (maximum amplitude)−3 [dB]), the loss coefficient is defined as a value represented by {W/f}.

In order to prevent the resonance, the loss coefficient may be increased, namely, this means that the frequency width W becomes relatively large with respect to the amplitude h and the peak becomes broader.

Loss coefficient is a value inherent in a material, etc. For example, in the case of a glass sheet alone, the loss coefficient varies depending on the composition, relative density, etc. thereof. Loss coefficient can be determined by a dynamic modulus test such as a resonance method.

The term "longitudinal wave acoustic velocity" means a velocity at which a longitudinal wave propagates in an object. The longitudinal wave acoustic velocity can be measured by the ultrasonic pulse method described in Japanese Industrial Standards (JIS-R1602-1995)

(Liquid Layer)

Since the display device according to the present invention includes a layer made of a liquid (liquid layer) disposed between at least two (at least a pair of) plate-shaped objects, a high loss coefficient can be achieved. In particular, the loss coefficient can be made larger by controlling the viscosity and surface tension of the liquid layer to fall within suitable ranges. This is considered attributed to the fact that, unlike the case of disposing a pair of plate-shaped objects with an adhesive layer interposed therebetween, the pair of plate-shaped objects is not fixed and continues maintaining the vibration characteristics of each individual plate-shaped object.

The liquid layer preferably has a viscosity coefficient at 25° C. of $1\times10^{-4}$ to $1\times10^{3}$ Pa·s and a surface tension at 25° C. of 15 mN/m-80 mN/m. In case where the viscosity thereof is too low, this liquid layer is less apt to transmit vibrations. In case where the viscosity thereof is too high, the two plate-shaped objects respectively on both sides of the liquid layer are fixed to exhibit a vibration behavior as one plate-shaped object, becoming less effective in damping vibration due to resonance. Meanwhile, in case where the surface tension thereof is too low, the plate-shaped objects have reduced adhesion therebetween and are less apt to transmit vibrations. In case where the surface tension thereof is too high, the two plate-shaped objects respectively on both sides of the liquid layer are apt to be fixed to exhibit a vibration behavior as one plate-shaped object, becoming less effective in damping vibration due to resonance.

The liquid layer has a viscosity coefficient at 25° C. of more preferably $1\times10^{-3}$ Pa·s or higher, still more preferably $1\times10^{-2}$ Pa·s or higher. The viscosity coefficient thereof is more preferably $1\times10^{2}$ Pa-s or less, still more preferably $1\times10$ Pa·s or less. The liquid layer has a surface tension at 25° C. of more preferably 17 mN/m or higher, still more preferably 30 mN/m or higher.

The viscosity coefficient of the liquid layer can be measured with a rotational viscometer, etc. The surface tension of the liquid layer can be measured by a ring method, etc.

In case where the liquid layer has too high a vapor pressure, some of this liquid layer may vaporize, making the display device unable to perform its function. The liquid layer hence has a vapor pressure at 25° C. and 1 atm of preferably $1\times10^{4}$ Pa or less, more preferably $5\times10^{3}$ Pa or less, still more preferably $1\times10^{3}$ Pa or less.

The liquid layer having smaller thickness is preferred from the standpoints of retaining high rigidity of the display device and of transmitting vibrations. Specifically, when the total thickness of the two plate-shaped objects is 1 mm or less, the liquid layer has a thickness of preferably 1/10 or less, more preferably 1/20 or less, still more preferably 1/30 or less, yet still more preferably 1/50 or less, even still more preferably 1/70 or less, even yet still more preferably 1/100 or less, of the total thickness of the two plate-shaped objects.

In the case where the total thickness of the two plate-shaped objects exceeds 1 mm, the liquid layer has a thickness of preferably 100 μm or less, more preferably 50 μm or less, still more preferably 30 μm or less, yet still more preferably 20 μm or less, even still more preferably 15 μm or less, even yet still more preferably 10 μm or less.

A lower limit of the thickness of the liquid layer is preferably 0.01 μm or larger from the standpoints of production efficiency and durability.

It is preferable that the liquid layer is chemically stable and does not react with either of the two plate-shaped objects lying respectively on both sides of the liquid layer. The term "chemically stable" means, for example, that the liquid layer is less apt to be altered (deteriorated) by light irradiation and undergoes none of solidification, vaporization, decomposition, discoloration, chemical reaction with the plate-shaped objects, and the like at least in the temperature range of −20° C. to 70° C.

Examples of ingredients usable as the liquid layer include water, oils, organic solvents, liquid polymers, ionic liquids, and mixtures of two or more of these.

More specific examples thereof include propylene glycol, dipropylene glycol, tripropylene glycol, straight silicone oils (dimethyl silicone oil, methyl phenyl silicone oil, and methyl hydrogen silicone oil), modified silicone oils, acrylic-acid-based polymers, liquid polybutadiene, glycerin paste, fluorochemical solvents, fluororesins, acetone, ethanol, xylene, toluene, water, mineral oil, and mixtures of two or more of these. It is preferable that the liquid layer includes at least one member selected from the group consisting of a dimethyl silicone oil, a methyl phenyl silicone oil, a methyl hydrogen silicone oil, and modified silicone oils, among those. It is more preferable that the liquid layer includes a silicone oil as a main component.

Also usable as the liquid layer besides those ingredients is a slurry containing particles dispersed therein. Although the liquid layer preferably is a homogeneous fluid from the standpoint of improving the loss coefficient, the slurry is effective in the case of imparting design attractiveness or a function, such as coloration or fluorescence, to the display device.

The content of the particles in the liquid layer is preferably 0-10 vol %, more preferably 0-5 vol %.

The particles have a particle diameter of preferably 10 nm to 10 μm, more preferably 0.5 μm or less, from the standpoint of preventing sedimentation.

The liquid layer may contain a fluorescent material from the standpoint of imparting design attractiveness or a function. This liquid layer may be either a slurry liquid layer which contains a particulate fluorescent material dispersed therein or a homogeneous liquid layer in which a liquid fluorescent material has been mixed. Accordingly, the optical function, such as absorbing light and emitting light can be imparted to the display device.

(Seal Material)

The seal material is in close contact with edge portions of the first plate-shaped object, edge surfaces of the liquid layer, and edge portions of the second plate-shaped object. The display device may include a resin layer between the second plate-shaped object and the liquid layer. In this case, the seal material is in close contact with the edge surfaces of the first plate-shaped object, the edge surfaces of the liquid layer, and the resin layer. In the case where an edge surface of the first plate-shaped object and an edge surface of the liquid layer are perpendicular to the resin layer, the seal material has an L-shaped contour in a cross-sectional view. This configuration improves the strength of the display device.

It is preferable that the seal material includes at least one resin selected from the group consisting of a poly(vinyl acetate)-based resin, a poly(vinyl chloride)-based resin, a poly(vinyl alcohol)-based resin, an ethylene-copolymer-based resin, a poly(acrylic ester)-based resin, a cyanoacrylate-based resin, a saturated-polyester-based resin, a polyamide-based resin, a linear-polyimide-based resin, a melamine resin, a urea resin, a phenolic resin, an epoxy-based resin, a polyurethane-based resin, an unsaturated-polyester-based resin, a reactive acrylic resin, a rubber-based resin, a silicone-based resin, and a modified-silicone-based resin.

(Plate-Shaped Objects)

The display device according to the present invention includes at least two (at least a pair of) plate-shaped objects disposed so as to sandwich the liquid layer therebetween. It is preferable that at least one of the two plate-shaped objects is constituted of a glass sheet.

In this configuration, when either of the plate-shaped objects resonates, the presence of the liquid layer can prevent the other plate-shaped object from resonating or can damp the resonant vibration of the other plate-shaped object. The display device can hence have a higher loss coefficient than single plate-shaped objects.

It is preferable that, of the first plate-shaped object and the second plate-shaped object, which constitute the pair of plate-shaped objects, one plate-shaped objection and the other plate shaped object have different peak top values of resonant frequency. It is more preferable that the ranges of resonant frequency of the two plate-shaped objects do not overlap each other. However, even though the range of resonant frequency of the first plate-shaped object and that of the second plate-shaped object overlap each other or the two plate-shaped objects have the same peak top value, the presence of the liquid layer prevents the resonance of one plate-shaped object from causing synchronous vibration to the other plate-shaped object and thereby reduces the resonance to some degree. A high loss coefficient can hence be obtained as compared with the case of single plate-shaped objects.

More specifically, denoting $Qa$ and $wa$ respectively as the resonant frequency (peak top) and the half-width of resonance amplitude of one of the plate-shaped objects and denoting $Qb$ and $wb$ respectively as the resonant frequency (peak top) and the half-width of resonance amplitude of the other plate-shaped object, it is preferable that the relationship represented by the following formula (1) is satisfied.

$$(wa+wb)/4 < |Qa-Qb| \tag{1}$$

The larger the value of the left side of formula (1), the larger the difference ($|Qa-Qb|$) in resonant frequency between the two plate-shaped objects and the higher the loss coefficient. It is hence preferable that the two plate-shaped objects have such properties.

Accordingly, it is more preferable that the following formula (2) is satisfied, and it is still more preferable that the following formula (3) is satisfied.

$$(wa+wb)/2 < |Qa-Qb| \tag{2}$$

$$(wa+wb)/1 < |Qa-Qb| \tag{3}$$

The resonant frequency (peak top) and half-width of resonance amplitude of each plate-shaped object can be determined by the same method as the loss coefficient of the display device.

It is preferred that the mass difference between the first plate-shaped object and the second plate-shaped object is smaller, and it is more preferred that there is no mass difference therebetween. In cases when the plate-shaped objects have different mass, the resonance of the lighter plate-shaped object can be reduced by the heavier plate-shaped object but it is difficult to reduce the resonance of the heavier plate-shaped object by the lighter plate-shaped object. This is because if the mass ratio is imbalanced, vibrations due to resonance cannot theoretically be mutually eliminated because of the difference in inertial force.

The mass ratio between the two plate-shaped objects which is represented by (one plate-shaped object)/(the other plate-shaped object) is preferably 0.1-10.0 (from 1/10 to 10/1), more preferably 0.5-2.0 (from 5/10 to 10/5), even more preferably 1.0 (10/10; mass difference, 0).

The smaller the thicknesses of the first plate-shaped object and second plate-shaped object, the more easily the plate-shaped objects adhere to each other with the liquid layer interposed therebetween and the smaller the amount of energy necessary for vibrating the plate-shaped objects. Hence, for use in display device applications, the smaller the thickness of each plate-shaped object, the better. Specifically, the sheet thickness of each of the two plate-shaped objects is preferably 15 mm or less, more preferably 10 mm or less, still more preferably 5 mm or less, yet still more preferably 3 mm or less, even still more preferably 1.5 mm or less, even yet still more preferably 0.8 mm or less. Meanwhile, if the thickness is too small, the impact of surface defects of the plate-shaped objects becomes noticeable, cracks are likely to occur and strengthening treatment becomes difficult. Hence, the thickness thereof is preferably 0.01 mm or larger, more preferably 0.05 mm or larger.

For use in opening member applications in buildings or vehicles, which are reduced in the occurrence of an abnormal noise attributed to a resonance phenomenon, the thicknesses of one plate-shaped object and the other plate-shaped object are each preferably 0.5-15 mm, more preferably 0.8-10 mm, still more preferably 1.0-8 mm.

It is preferable, for use in display device applications, that the first plate-shaped object and/or the second plate-shaped object has a high loss coefficient, because this enables the display device to show enhanced vibration damping. Specifically, the loss coefficient at 25° C. of the plate-shaped object(s) is preferably $1 \times 10^{-4}$ or higher, more preferably $3 \times 10^{-4}$ or higher, still more preferably $5 \times 10^{-4}$ or higher. There is no particular upper limit, but the loss coefficient thereof is preferably $5 \times 10^{-3}$ or less from the standpoints of productivity and manufacturing cost. It is more preferable that both the first plate-shaped object and the second plate-shaped object have that loss coefficient.

The loss coefficient of each plate-shaped object can be determined by the same method as the loss coefficient of the display device.

It is preferable, for use in display device applications, that the first plate-shaped object and/or the second plate-shaped object has a high longitudinal wave acoustic velocity in the sheet thickness direction, because the sound reproducibility in a high-frequency region is enhanced. Specifically, the longitudinal wave acoustic velocity of the plate-shaped object(s) is preferably $4.0 \times 10^3$ m/s or higher, more preferably $5.0 \times 10^3$ m/s or higher, still more preferably $6.0 \times 10^3$ m/s or higher. There is no particular upper limit, but the longitudinal wave acoustic velocity thereof is preferably $7.0 \times 10^3$ m/s or less from the standpoints of the productivity of the plate-shaped objects and raw material cost. It is more preferable that both the first plate-shaped object and the second plate-shaped object satisfy that acoustic velocity.

The acoustic velocity of each plate-shaped object can be measured by the same method as the longitudinal wave acoustic velocity of the display device.

In the display device according to the present invention, it is preferable that one of the plate-shaped objects is composed of at least one glass sheet. The material of the other plate-shaped object is not limited, and any of non-glass sheets including resin sheets made of resins can be adopted. From the standpoints of design attractiveness and processability, it is preferred to use a resinous sheet or a composite material thereof. Especially preferred is to use a resinous sheet made of an acrylic-based resin, a polyimide resin, a polycarbonate resin, a PET resin, or an FRP material.

When the other plate-shaped object is made of resin, the resins are preferably flexible. Use can be made of acrylic resins, polycarbonate resins, polyimide resins, polyethersulfone resins, poly(ethylene terephthalate) resins, and the like. In cases when the plate-shaped objects have flexibility, the display device can be adopted in thin TVs, smartphones, portable displays, etc.

In the case where at least one of the plate-shaped objects is a glass sheet, the composition of the glass sheet is not particularly limited. However, the contents of components thereof are, for example, preferably in the following ranges.

40-80 mass % $SiO_2$, 0-35 mass % $Al_2O_3$, 0-15 mass % $B_2O_3$, 0-20 mass % MgO, 0-20 mass % CaO, 0-20 mass % SrO, 0-20 mass % BaO, 0-20 mass % $Li_2O$, 0-25 mass % $Na_2O$, 0-20 mass % $K_2O$, 0-10 mass % $TiO_2$, and 0-10 mass % $ZrO_2$. These components account for at least 95 mass % of the entire glass.

More preferably, the glass sheet has the composition including the following components in amounts within the following ranges.

55-75 mass % $SiO_2$, 0-25 mass % $Al_2O_3$, 0-12 mass % $B_2O_3$, 0-20 mass % MgO, 0-20 mass % CaO, 0-20 mass % SrO, 0-20 mass % BaO, 0-20 mass % $Li_2O$, 0-25 mass % $Na_2O$, 0-15 mass % $K_2O$, 0-5 mass % $TiO_2$, and 0-5 mass % $ZrO_2$. These components account for at least 95 mass % of the entire glass.

A specific modulus is a value obtained by dividing the Young's modulus by the density, and the higher the specific modulus of the glass sheet, the higher the rigidity of the glass sheet. Specifically, the glass sheet has a specific modulus of preferably $2.5 \times 10^7$ $m^2/s^2$ or higher, more preferably $2.8 \times 10^7$ $m^2/s^2$ or higher, still more preferably $3.0 \times 10^7$ $m^2/s^2$ or higher. Although there is no particular upper limit, the specific modulus thereof is preferably $4.0 \times 10^7$ $m^2/s^2$ or less from the standpoint of formability during glass production. The Young's modulus can be determined by the ultrasonic pulse method described in Japanese Industrial Standards (JIS-R1602-1995).

The lower the specific gravity of each glass sheet, the smaller the amount of energy necessary for vibrating the glass sheet. Specifically, the glass sheet has a specific gravity of preferably 2.8 or less, more preferably 2.6 or less, still more preferably 2.5 or less. Although there is no particular lower limit, the specific gravity thereof is preferably 2.2 or higher.

(Display Element)

In the display device of the present invention, the display element preferably is an OLED. Examples of the display element include organic polymers, liquid crystals, LEDs, and the like, OLEDs are suitable for use in television devices that are thin and flexible. An OLED has a structure including opposed transparent substrates and an organic thin film sealed up therebetween, and it is made into a display module by connecting a driving circuit (e.g., an IC) and electrodes with FPC wiring to OLEDs. By making the display module thinner, the acoustic characteristics can be improved. The display element has been sealed with a barrier film, and there may be a barrier layer such as a sealing layer of SiN or the like or a thin metal layer, e.g., a stainless-steel foil, between the barrier film and the display element.

(Resin Layers)

At least one resin layer may be disposed between the first plate-shaped object and the second plate-shaped object. In cases when the display device includes a plurality of resin layers, a first resin layer is disposed on at least one surface of the display module and a second resin layer is disposed on at least one surface of the first plate-shaped object. The display device may include at least one resin layer which covers side surfaces of the first plate-shaped object.

A shattering-preventive function and a piercing-preventive function may be imparted to the resin films. Thus, in cases when the display device is adopted in a window-glass or outdoor applications or in environments where breakage can occur, then the plate-shaped objects can be made to prevent broken pieces from scattering upon breakage and user safety can be ensured.

The resin layers may include PET, PVB, polycarbonates, or the like. Other usable resins include cellulose-based resins, acrylic-based resins, polyester-based resins, polyolefin-based resins, vinyl-based resins.

A vapor-deposited metal layer, a colored layer, an ultraviolet-absorbing layer, or the like may be formed on one or both surfaces of each resin layer.

Each resin layer may have an adhesive layer or pressure-sensitive adhesive layer for bonding to the plate-shaped object. The adhesive layer or pressure-sensitive adhesive layer can be formed on one or both surfaces of the resin layer.

The adhesive layer or pressure-sensitive adhesive layer may contain an acrylic-based resin, epoxy-based resin, urethane-based resin, silicone-based resin, polyimide-based resin, polyester-based resin.

The resin layers may contain materials having functions such as UV-blocking, heat-insulating, heat-blocking, light-blocking, polarizing, projecting, reflecting, mirror-surface, insect-proofing, design-attractive, coloring, electromagnetic-shielding, etc. Thus, further functions can be imparted besides the shattering-preventive function.

In the resonant-frequency region for the plate-shaped objects to be used and in the resonant-frequency region for the resin materials to be used, the higher the loss coefficient (tan δ) of the adhesive layer or pressure-sensitive adhesive layer, the better. The loss coefficient thereof is preferably 0.001 or higher, more preferably 0.01 or higher, exceedingly preferably 0.1 or higher. When the loss coefficients thereof is 1.0 or higher, viscosity contributes more than elasticity to effectively inhibit vibrations including resonance. Such loss coefficients are especially preferred.

As indicated in JIS A5759, the adhesive force of the resin layer for shattering prevention is preferably 4 N/25-mm width or higher and that of the resin layer for piercing prevention is preferably 8 N/25-mm width or higher.

In the case where a resin layer having a shattering-preventive function and a piercing-preventive function is provided as a surface layer of a plate-shaped object, a crosslinking coating layer which itself has a self-healing function may be made as the resin layer. Thus, deterioration of the resin layer can be prevented and the layer can have a prolonged life.

In the case where a resin layer having a shattering-preventive function and a piercing-preventive function is provided as a surface layer of a plate-shaped object, a hardcoat resin layer may be provided as an outermost surface. Thus, abrasion and deterioration of the resin layer can be prevented.

As indicated in JIS A5759, the shattering-preventive resin layer and the piercing-preventive resin layer preferably have a tensile elongation of 60% or higher.

As indicated in JIS A5759, the shattering-preventive resin layer preferably has a tensile strength of 100 N/mm width or higher and the piercing-preventive resin layer preferably has a tensile strength of 800 N/mm width or higher.

It is preferable that the resin layers, the adhesive layer or pressure-sensitive adhesive layer, and the hardcoat resin layer do not deteriorate or turn yellow due to light.

In the case where a resin layer is in a film form, it is preferable that the film to be laminated is free from defects such as, for example, swelling, cracking, or edge peeling.

Even though resin layers are provided, the resultant decrease in the acoustic velocity of the display device can be kept to a given value. The acoustic velocity thereof is preferably 4,000 m/s or higher, more preferably 4,500 m/s or higher, still more preferably 5,000 m/s or higher, exceedingly preferably 5,500 m/s or higher, especially preferably 6,000 m/s or higher.

(First Plate-Shaped Object and Display Module)

The thickness ratio between the first plate-shaped object and the display module preferably is from 1:10 to 10:1.

The smaller the difference in thickness between the first plate-shaped object and the display module, the better. It is more preferable that there is no difference in thickness therebetween (the thickness ratio being 1:1). In the case where the thickness of the first plate-shaped object is smaller than the thickness of the display module, this plate-shaped object has relatively low rigidity, and thus it is difficult to sufficiently inhibit the resonance of the display module. Meanwhile, in the case where the thickness of the first plate-shaped object is larger than the thickness of the display module, the display module has relatively low rigidity, and thus it is difficult to sufficiently inhibit the resonance of the plate-shaped object.

It is preferable that the mass ratio between the first plate-shaped object and the display module is from 1:10 to 10:1.

The smaller the difference in mass between the first plate-shaped object and the display module, the better. It is more preferable that there is no difference in mass therebetween (the mass ratio being 1:1). In the case where there is a difference in mass between the first plate-shaped object and the display module, the resonance of the lighter member can be reduced by the heavier member but it is difficult to reduce the resonance of the heavier member by the lighter member. This is because if the mass ratio is imbalanced, vibrations due to resonance cannot be mutually cancelled in principle because of the difference in inertial force.

(Display Device)

At least one of the plate-shaped objects and/or the liquid layer, included in the display device may be colored. This is useful when manufacturers desire to give design attractiveness or a function, such as IR cut, UV cut, or privacy glass to the display device.

Although it is preferable that at least one of the plate-shaped objects included in the display device is a glass sheet, two or more glass sheets may be used. In this case, glass sheets which all differ in composition may be used or glass sheets which all have the same composition may be used. Glass sheets having the same composition may be used in combination with a glass sheet having a different composition. Among others, it is preferred to use two or more kinds of glass sheets differing in composition, from the standpoint of vibration damping.

Similarly, as to the mass and thickness, the glass sheets may be all different, may be all the same, or some may be different. Above all, from the standpoint of vibration damping, all of the constituent glass sheets preferably have the same mass.

A physically strengthened glass sheet or a chemically strengthened glass sheet may be used as at least one of the glass sheets constituting the display device. This is useful in preventing the display device from breaking. When an increase in the strength of the display device is desired, it is preferable that a physically strengthened glass sheet or a chemically strengthened glass sheet is used as the glass sheet located in an outermost surface of the display device, and it is more preferable that all of the constituent glass sheets are each a physically strengthened glass sheet or a chemically strengthened glass sheet.

From the standpoint of increasing the longitudinal wave acoustic velocity and the strength, it is also useful to use crystallized glass or phase-separated glass as a glass sheet. Especially when an increase in the strength of the display device is desired, it is preferred to use the crystallized glass or phase-separated glass as the glass sheet located in an outermost surface of the display device.

A coating or a film may be formed on at least one outermost surface of the display device, so long as the effects of the present invention are not impaired. Formation of a coating or attachment of a film is suitable for scratch protection, etc.

It is preferred that the coating or the film has a thickness of ⅕ or less of the sheet thickness of the surface glass sheet. The coating and the film can be conventionally known ones. Examples of the coating include a water-repellent coating, a hydrophilic coating, a water sliding coating, an oil-repellent coating, a light reflection preventive coating, a heat shielding coating, and a highly reflective coating. Examples of the film include a shatter-proof film for glass, a color film, a UV cut film, an IR cut film, a heat-shielding film, an electromagnetic wave shielding film, and a screen film for projectors.

The shape of the display device can be appropriately designed in accordance with applications, and may be a flat plate-like shape or a curved surface shape. The shape thereof may be a rectangular, triangular, circular, or polygonal shape, etc. in a plan view.

In order to raise the output sound pressure level in a low-frequency range, the display device can be made to have a structure including an enclosure or a baffle plate. Although the material of the enclosure or baffle plate is not particularly limited, it is preferable to use the display device of the present invention.

A frame may be provided to at least one outermost surface of the display device so long as the effects of the present invention are not impaired. The frame is useful, for example, when it is desired to enhance the rigidity of the display device or maintain a curved surface shape. As the material of the frame, a conventionally known material may be used. For example, use can be made of ceramics and single-crystal materials such as $Al_2O_3$, SiC, $Si_3N_4$, AlN, mullite, zirconia, yttria, and YAG, metal and alloy materials such as steel, aluminum, titanium, magnesium, and tungsten carbide, composite materials such as FRPs, resin materials such as acrylics and polycarbonates, glass materials, and wood.

The frame to be used has a weight preferably 20% or less, more preferably 10% or less, of the weight of the glass sheet.

A seal member may be interposed between the display device and the frame. Furthermore, at least some of outer circumferential edge surfaces of the display device may be sealed by a seal member which does not hinder the display device from vibrating. As the seal members, use can be made of a highly elastic rubber, a resin, a gel, etc.

As the resin for the seal members, use can be made of acrylic, cyanoacrylate-based, epoxy-based, silicone-based, urethane-based, and phenolic resins. Examples of curing methods include one-pack type, two-pack mixing type, heat curing, ultraviolet curing, and visible light curing.

A thermoplastic resin (hot-melt bond) is also usable. Examples thereof include (ethylene/vinyl acetate)-based, polyolefin-based, polyamide-based, synthetic rubber-based, acrylic, and polyurethane-based resins.

As the rubber, use can be made of natural rubber, synthetic natural rubber, butadiene rubber, styrene-butadiene rubber, butyl rubber, nitrile rubber, ethylene-propylene rubber, chloroprene rubber, acrylic rubber, chlorosulfonated polyethylene rubber (Hypalon), urethane rubber, silicone rubber, fluororubber, ethylene-vinyl acetate rubber, epichlorohydrin rubber, polysulfide rubber (Thiokol), and hydrogenated nitrile rubber.

In case where the thickness t of each seal member is too small, sufficient strength is not ensured. In case where the thickness t thereof is too large, the seal member may hinder vibrations. Consequently, the seal member has a thickness of preferably 10 µm or larger and up to 5 times the overall thickness of the display device, and is more preferably 50 µm or larger and smaller than the overall thickness of the display device.

At least some portions of the opposed surfaces of the plate-shaped objects may be coated with the seal member in order to, for example, prevent separation at the interface between each plate-shaped object and liquid layer of the display device, so long as the effects of the present invention are not impaired. In this case, the area of the seal member-coated portion is preferably 20% or less, more preferably 10% or less, still more preferably 5% or less, of the area of the liquid layer so as not to hinder vibrations.

In order to enhance the sealing performance, edge portions of each plate-shaped object can be processed into an appropriate shape. For example, edge portions of at least one of the plate-shaped objects may be processed by C-chamfering (the plate-shaped object has a trapezoidal cross-sectional shape) or R-chamfering (the plate-shaped object has an approximately arc cross-sectional shape), thereby increasing the area of contact between the seal member and the plate-shaped object. Thus, the strength of adhesion between the seal member and the plate-shaped object can be enhanced.

(Vibrator)

The display device has a vibrator in the first plate-shaped object or the display module.

The display device can be made to function as a loudspeaker, a microphone, an earphone, or a casing's vibrating body or casing's speaker of a mobile device, etc. by disposing, for example, one or more vibration elements or vibration detection elements as vibrators on one side or both sides of the display device (or display module). In order to enhance the output sound pressure level, two or more vibration elements are preferably disposed on both sides of the display device. Thus, the display device and the television device no longer need any external loudspeaker, and enable to attain better acoustic characteristics than conventional devices in which single glass sheets are directly vibrated.

In general, the position of the vibrators is preferably the central portion of the display device, but since the material has a high acoustic velocity and a high damping performance, the vibrator may be disposed at an edge portion of the display device. Use of the display device according to the present invention can facilitate reproduction of the sound in a high-frequency region that had been conventionally difficult to be reproduced. In addition, the display device has high degree of freedom in the size, shape, color, etc., and a design can be applied thereto, so that the display device enables to obtain a vibrator with excellent design. Furthermore, by sampling sound or vibration by a sound collecting microphone or a vibration detector disposed on the surface or in the vicinity of the display device and generating vibration of the same phase or reverse phase in the display device, the sound or vibration sampled can be amplified or canceled.

At this time, in the case where the sound or vibration characteristics at the sampling point above are caused to undergo a change based on a certain acoustic transfer function in the course of propagating to the display device, and in the case where an acoustic conversion transfer function is present in the display device, the vibration can be accurately amplified or canceled by correcting the amplitude and phase of the control signal by means of a control filter. At the time of constructing the control filter above, for example, the least-square (LMS) algorithm can be used.

In a more specific configuration, for example, the display device of the present invention is used as all or at least one of the glass sheets of a double glass. A structure can be thus produced in which the vibration level of the sheet at the inflow side of a sonic vibration to be controlled or the sound pressure level of a space present between glasses is sampled and, after appropriate signal correction by a control filter, output to a vibration element on the display device disposed at the outflow side of the sonic vibration.

This display device can be utilized, for example, as a member for electronic devices, in a full-range loudspeaker, a loudspeaker for reproducing a low-pitched sound range of 15 Hz to 200 Hz, a loudspeaker for reproducing a high-pitched sound range of 10 kHz to 100 kHz, a large loudspeaker having a diaphragm area of 0.2 $m^2$ or more, a small loudspeaker having a diaphragm area of 3 $cm^2$ or less, a flat loudspeaker, a cylindrical loudspeaker, a transparent loudspeaker, a mobile device cover glass functioning as a loudspeaker, a TV display cover glass, a display outputting video signals and audio signals from the same surface, a loudspeaker for wearable displays, an electronic display device, and lighting equipment. In addition, this device can be used as a diaphragm or vibration sensor for headphones, earphones or microphones.

This display device can be used as an interior vibration member of transport machinery such as vehicle, or as an in-vehicle/in-machine loudspeaker and can form, for example, a side-view mirror, a sun visor, an instrument panel, a dashboard, a ceiling, a door, or other interior panels, each functioning as a loudspeaker. In addition, such a member can also be made to function as a microphone and a diaphragm for active noise control.

With respect to other uses, the display device can be used as a diaphragm for ultrasonic generators, a slider for ultrasonic motors, a low frequency generator, a vibrator for propagating sonic vibration in liquid, a water tank and a container each using the vibrator, a vibration element, a vibration detection element, and an actuator material for vibration damping equipment.

Embodiments of the Display Device

Figure 1B:
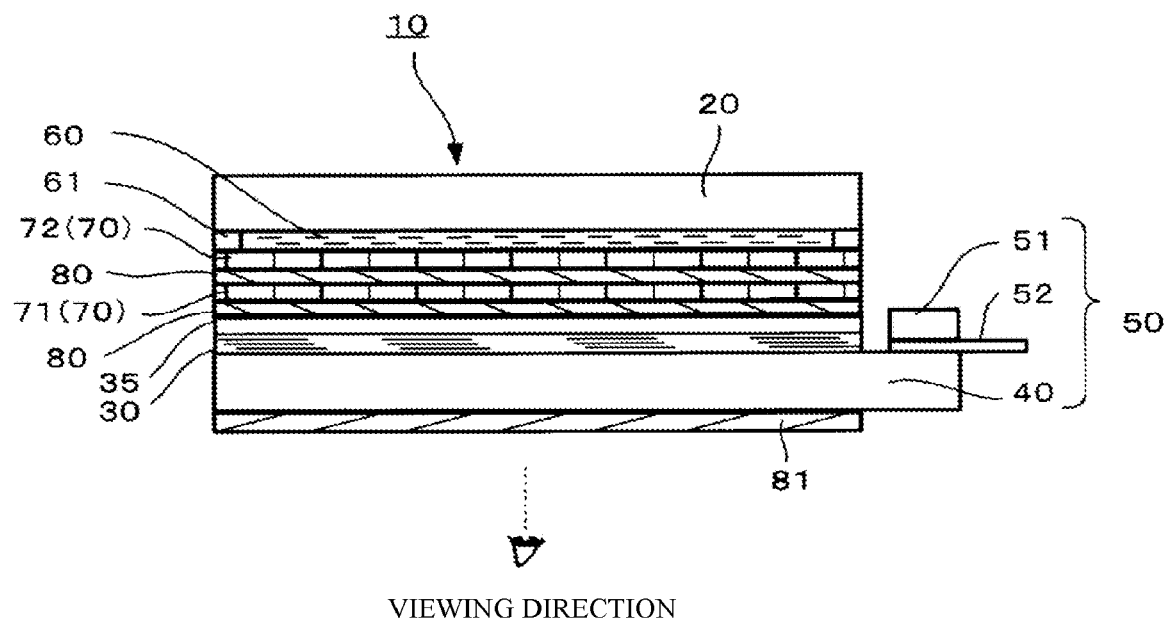

FIGS. 1A and 1B are cross-sectional views showing examples of the display device 10 of the present invention; FIG. 1A shows a first embodiment and FIG. 1B shows a second embodiment.

The display devices 10 each include: a first plate-shaped object 20; a display module 50 including a display element 30 and a second plate-shaped object 40 that supports the display element 30 and being disposed so as to face the first plate-shaped object 20; and a liquid layer 60 formed by sealing up a liquid between the first plate-shaped object 20 and the display module 50. The display element 30 has been sealed with a barrier film 35.

One or more resin layers 70 is disposed between the first plate-shaped object 20 and the second plate-shaped object 40. In the first embodiment, a first resin layer 71 is disposed over at least one surface of the display module 50. In the second embodiment, a second resin layer 72 is disposed over at least one surface of the first plate-shaped object 20.

The liquid layer 60 is sealed up between the first plate-shaped object 20 and the first resin layer 71 in the first embodiment, and is sealed up between the first plate-shaped object 20 and the second resin layer 72 in the second embodiment. A seal material 61 is in close contact with edge portions of the first plate-shaped object 20. In the first embodiment, the seal material 61 is in close contact with edge portions of the first resin layer 71, and in the second embodiment, the seal material 61 is in close contact with edge portions of the second resin layer 72. Thus, not only the liquid layer 60 is prevented from leaking out but also the bonding of the first plate-shaped object 20, liquid layer 60, and resin layer 70 is enhanced to increase the strength of the display device 10.

A first process for producing the first embodiment of the display device 10 is explained by reference to FIGS. 2A to 2E.

Figure 2A:
FIGS. 2A to 2E are a flow diagram showing a first process for producing the first embodiment of the display device according to the present invention.

<First Laminating Step: FIG. 2A>

A display element 30 sealed by a barrier film 35 is disposed on a surface of a second plate-shaped object 40, and a first resin layer 71 is laminated to it with a transparent adhesive (optical clear adhesive) or the like. Thus, an adhesive layer (pressure-sensitive adhesive layer) 80 is formed between the second plate-shaped object 40 and the first resin layer 71.

Figure 2B:
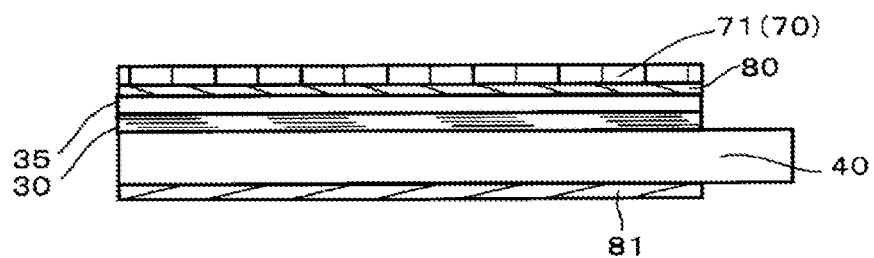

<Polarizing-Film Laminating Step: FIG. 2B>

A polarizing film (circularly polarizing film) 81 for preventing electrode reflection to improve visibility is laminated to the surface of the second plate-shaped object 40 on the side opposite to the first resin layer 71 side, with a pressure-sensitive adhesive or the like.

Figure 2C:
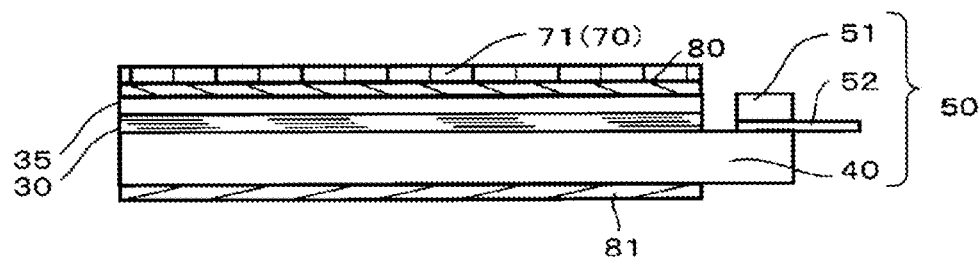

<Mounting Step: FIG. 2C>

A driving circuit (IC) 51 for driving the display element supported by the second plate-shaped object 40 and a flexible printed circuit (FPC) 52 serving as an electrode are mounted to form a display module 50.

Figure 2D:
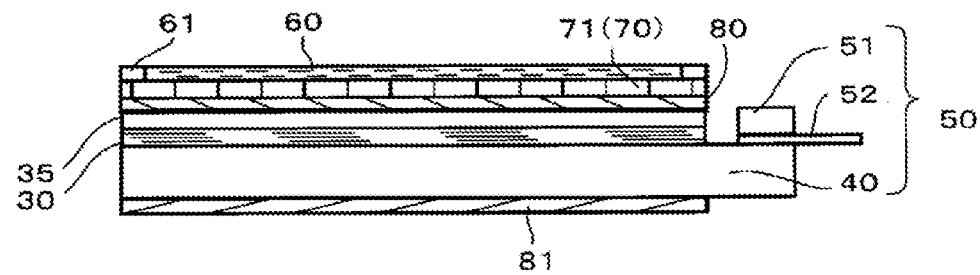

<Application Step: FIG. 2D>

After the display module 50 is inspected, a seal material 61 is disposed on the surface of the first resin layer 71 by drawing a line along edge portions thereof, and a liquid ingredient is applied to the area surrounded by the seal material 61, thereby forming a liquid layer 60.

The seal material 61 is disposed by drawing a line having a width of 0.5 mm at a distance of, for example, 1 mm from the edge portions using a dispenser, on the first resin layer 71 having, for example, a length of 100 mm, a width of 100 mm, and a thickness of 0.5 mm.

With respect to the ejection amount of the liquid ingredient, the liquid ingredient is applied while regulating the mass thereof so that the liquid layer 60 to be formed through laminating has a thickness of, for example, 3 μm. For example, in the case where the region inside the line of the seal material 61 has a length of 100 mm and a width of 100 mm and a liquid ingredient having a density of 1 g/cm$^3$ is to be applied thereto in a thickness of 3 μm, the desired application may be attained by controlling the ejection mass so as to result in a total application amount of 0.03 g. In this procedure, either of the seal material 61 and the liquid ingredient for forming the liquid layer 60 may be applied first for line drawing.

A first resin layer 71 having the same dimensions (200 mm×200 mm×0.5 mm) as the second plate-shaped object 40 is prepared and a dimethyl silicone oil having a dynamic viscosity at 25° C. of 3,000 (mm$^2$/s) and a methyl phenyl silicone oil are evenly applied as the liquid ingredient to the first resin layer 71 using a dispenser, while leaving an allowance having a width of 5 mm along the edge portions.

Figure 2E:
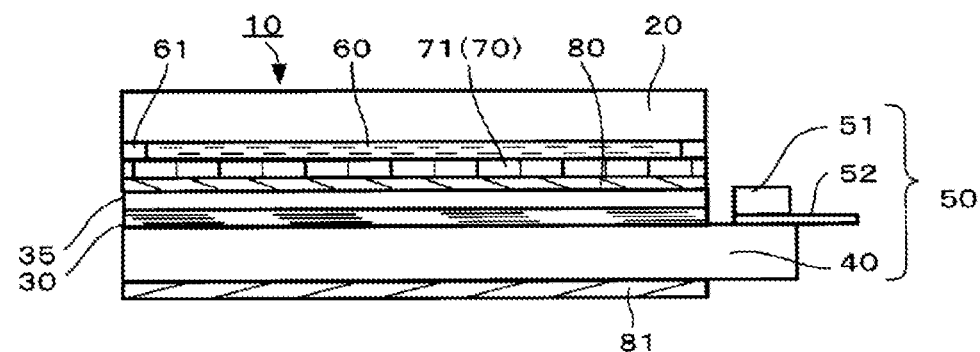

<Second Laminating Step: FIG. 2E>

The liquid layer 60 is applied within the seal material 61, and a first plate-shaped object 20 is laminated to the first resin layer 71 under a reduced pressure. Thereafter, the seal material 61 is cured. In the reduced-pressure laminating, the pressure is preferably 1,500 Pa or less, more preferably 300 Pa or less, still more preferably 100 Pa or less, especially desirably 10 Pa or less. After the laminating, the seal material 61 is cured by UV irradiation, heating, etc. in accordance with the mode of curing of the seal material 61 used.

During the laminating, the liquid ingredient (liquid) which has been applied inside spreads and comes into contact with the seal material 61 to apply force thereto from inside, and the seal material 61 spreads mainly outward. Although the seal material 61 spreads outward, the liquid ingredient does not leak out from the space between the first plate-shaped object 20 and the first resin layer 71 because of surface tension exerted at the edge portions of the first plate-shaped object 20 and first resin layer 71. Thus, a liquid layer 60 can be formed.

A second production process for producing a display device 10 according to the first embodiment is explained by reference to FIGS. 3A to 3E.

Figure 3A:
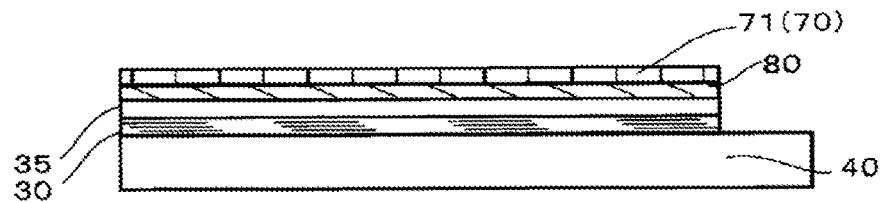
FIGS. 3A to 3E are a flow diagram showing a second process for producing the first embodiment of the display device according to the present invention.
Figure 3B:
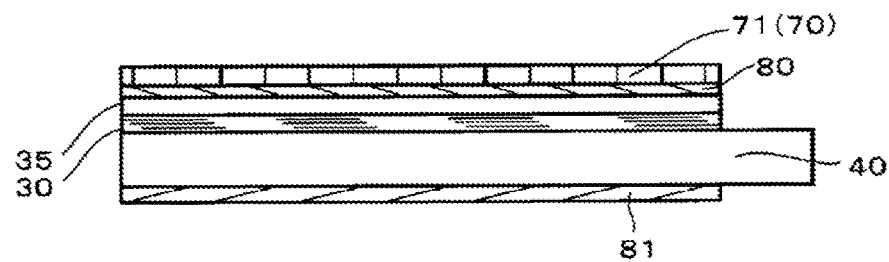
Figure 3C:
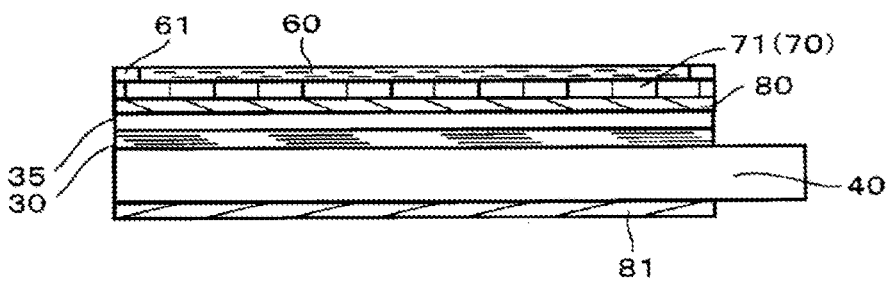
Figure 3D:
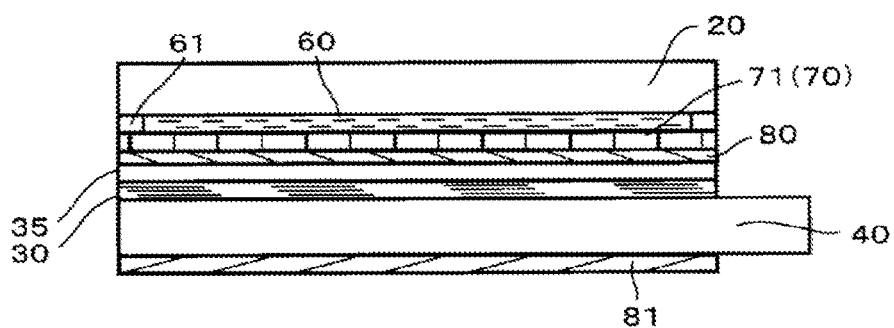
Figure 3E:
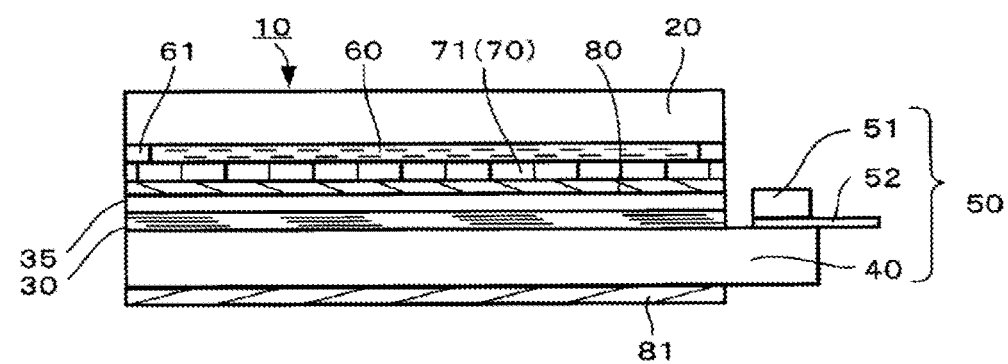
Figure 4A:
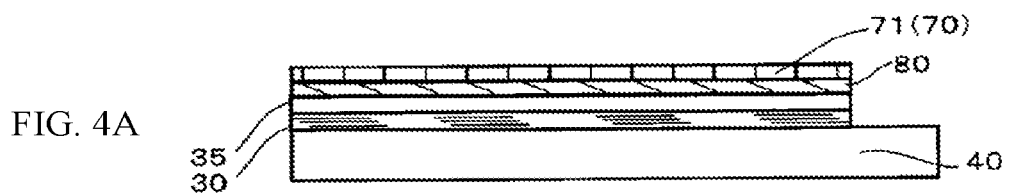
FIGS. 4A to 4F are a flow diagram showing a process for producing the second embodiment of the display device according to the present invention.
Figure 4B:
Figure 4C:
Figure 4D:
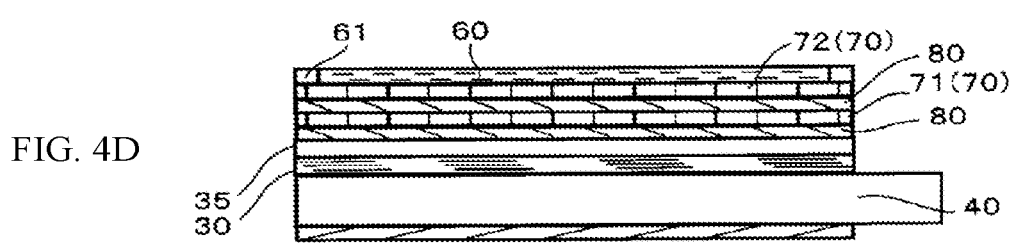
Figure 4E:
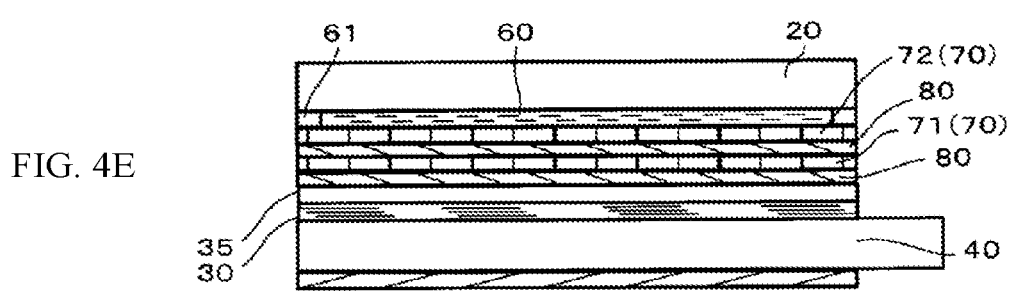
Figure 4F:
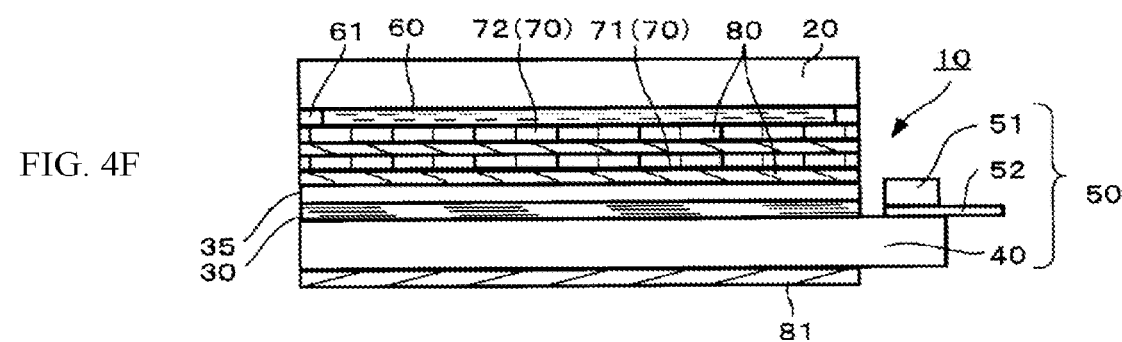

The explanation given above with reference to FIGS. 2A to 2E (first production process) was made in the order of the first laminating step, polarizing-film laminating step, mounting step, application step, and second laminating step. However, the mounting step may be performed last. Specifically, the second production process includes, in the following order, a first laminating step (FIG. 3A), a polarizing-film laminating step (FIG. 3B), an application step (FIG. 3C), a second laminating step (FIG. 3D), and a mounting step (FIG. 3E).

A process for producing the second embodiment of the display device 10 is explained by reference to FIGS. 4A to 4F.

This process for producing the second embodiment includes the same first laminating step (FIG. 4A) and polarizing-film laminating step (FIG. 4C) as those in the second process for producing the first embodiment, but differs from the second process in that this process includes a step (FIG. 4C) for laminating a second resin layer 72 to the surface of the first resin layer 71 after the polarizing-film laminating step and that this process includes an application step (FIG. 4D) in which a seal material 61 and a liquid layer 60 are formed on the surface of the second resin layer 72. Furthermore, this production process differs from the second process in that a second laminating step (FIG. 4E) includes bonding of the second resin layer 72 to a first plate-shaped object 20. In this production process, a mounting step (FIG. 4F) is conducted last.

Although a mounting step was conducted after the polarizing-film laminating step among the production steps in the first production process explained above, the mounting step may be conducted after the second laminating step as in the second production process.

The second resin layer 72 may be replaced with a third plate-shaped object. In this embodiment, the display device 10 includes a first plate-shaped object 20, a liquid layer 60, a third plate-shaped object, and a display module 50 which have been arranged in this order.

Figure 6A:
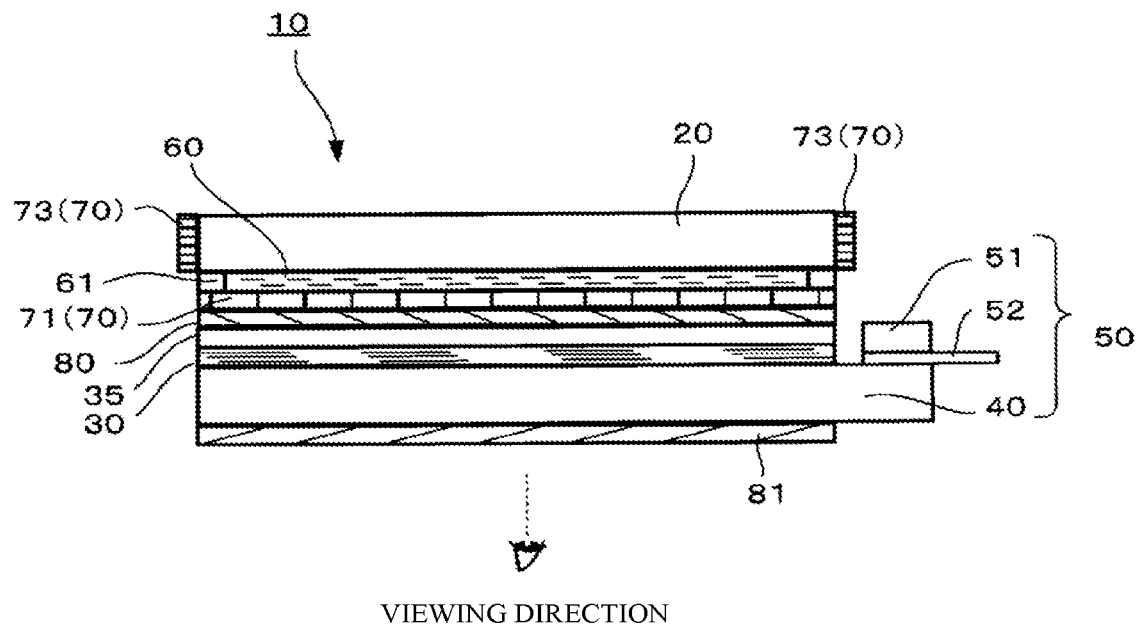
FIGS. 6A and 6B are cross-sectional views showing display devices according to the present invention in which a film has been applied to side surfaces thereof.
Figure 6B:
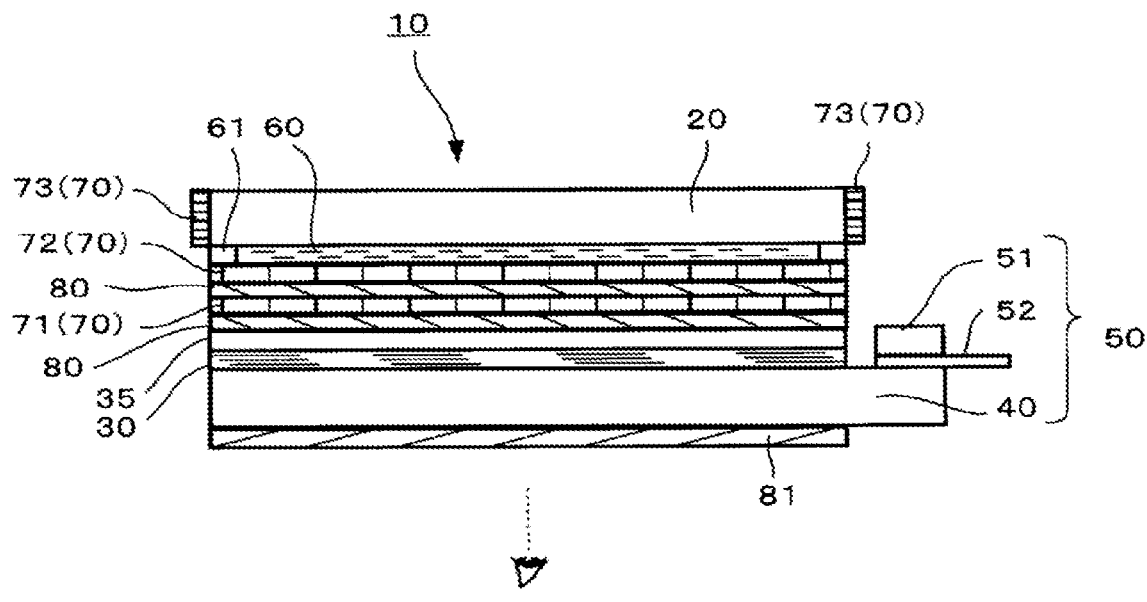

FIGS. 6A and 6B are cross-sectional views showing examples in which a third resin layer 73 has been applied to side surfaces of the first plate-shaped object 20 of a display device 10; FIG. 6A shows the first embodiment including the third resin layer 73 and FIG. 6B shows the second embodiment including the third resin layer 73.

The resin layer 70 has a shattering-preventive function and a piercing-preventive function both for preventing broken pieces from scattering when the plate-shaped objects 20 and 40 are damaged, and can ensure user safety. If the display device 10 is equipped with at least one resin layer 70 covering the side surfaces of the first plate-shaped object 20, this display device 10 can be safer when the first plate-shaped object 20, in particular made of a glass sheet, breaks.

Figure 5A:
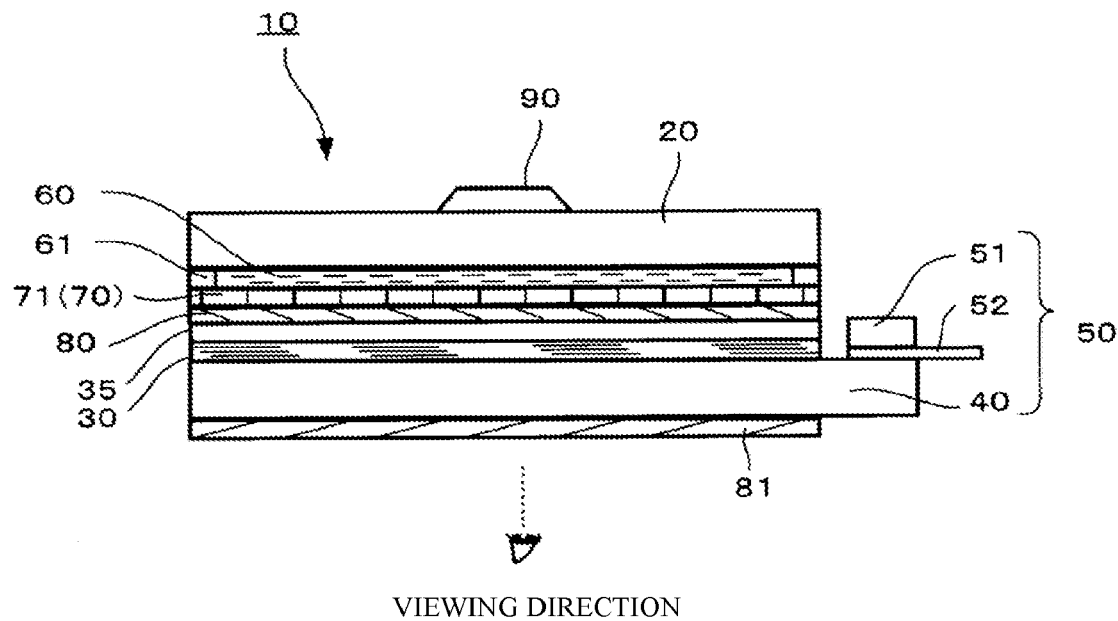
FIGS. 5A and 5B are cross-sectional views showing display devices according the present invention including a vibrator.
Figure 5B:
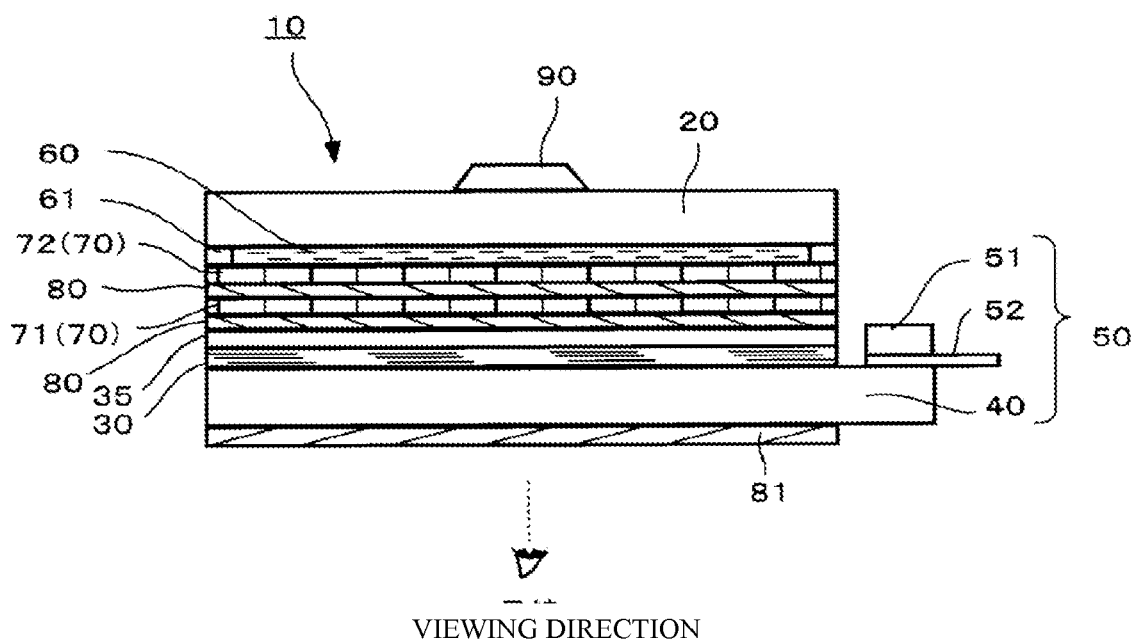

FIGS. 5A and 5B are cross-sectional views showing display devices 10 to which a vibrator 90 has been provided; FIG. 5A shows the first embodiment including the vibrator and FIG. 5B shows the second embodiment including the vibrator. The display device 10 can be made to function as a loudspeaker, a microphone, an earphone, or a casing's vibrating body or casing's speaker of a mobile device, etc. by disposing, for example, one or more vibrators (vibration elements or vibration detection elements) 90 on one side or both sides of the display device 10.

EXAMPLES

Each of the display devices 10 of the present invention had a structure including a display module 50 and a first plate-shaped object 20 laminated thereto. The effect of the thicknesses of the two members on acoustic control was examined. The table of FIG. 7 shows the results thereof. The display module 50 and the first plate-shaped object 20 each had sheet thicknesses of 0.2 mm, 0.5 mm, 0.7 mm, 2 mm, and 3 mm.

FIG. 7 is a table showing the results of the acoustic measurement of glass diaphragms having different thicknesses of the first plate-shaped object and flat-panel display module. As the sheet thickness ratio deviates from the range of 1:10 to 10:1, the results became poorer. The glass diaphragms made with sheet thicknesses of 3 mm and 0.2 mm were poor in reproduction. Meanwhile, when the sheet thickness ratio was closer to 1:1, good results were obtained (see the symbol ○ in the table).

The present invention is not limited to the embodiments described above, and modifications, improvements, etc. can be suitable made therein. The constituent elements in the embodiments are each not limited in the material, shape, dimensions, numerical values, form, number, place of disposition, etc. thereof so long as the present invention can be achieved.

While the invention has been described in detail and with reference to specific embodiments thereof, it will be apparent to one skilled in the art that various changes and modifications can be made therein without departing from the spirit and scope thereof. This application is based on a Japanese patent application filed on Oct. 4, 2017 (Application No. 2017-194638), the entire contents thereof being incorporated herein by reference. All the references cited here are incorporated herein as a whole.

INDUSTRIAL APPLICABILITY

The display device and television device of the present invention include a liquid layer disposed between a plate-shaped object and a display module, and are best fit for displays attempting to achieve both preferred acoustic characteristics and a reduced thickness.

REFERENCE SIGNS LIST

10 Display device
20 First plate-shaped object
30 Display element
40 Barrier film
50 Second plate-shaped object
50 Display module
51 Driving circuit (IC)
52 Flexible printed circuit (FPC)
60 Liquid layer
61 Seal material
70 Resin layer
71 First resin layer
72 Second resin layer
73 Third resin layer
80 Adhesive layer
81 Polarizing film
90 Vibrator

The invention claimed is:
1. A display device comprising
a first plate-shaped object,
a display module comprising a display element and a second plate-shaped object that supports the display element, the display module being disposed so as to face the first plate-shaped object,
a liquid layer formed by sealing up a liquid between the first plate-shaped object and the display module, and
a vibrator provided to the first plate-shaped object and/or the display module,
wherein the display device has a loss coefficient at 25° C. of $1 \times 10^{-2}$ or higher, a thickness ratio between the first plate-shaped object and the display module is from 1:10 to 10:1.

2. The display device according to claim 1, wherein at least one of the first plate-shaped object and the second plate-shaped object is composed of a glass sheet.

3. The display device according to claim 1, wherein the display element is an OLED.

4. The display device according to claim 1, comprising a first resin layer that is disposed on at least one surface of the display module.

5. The display device according to claim 1, comprising a second resin layer that is disposed on at least one surface of the first plate-shaped object.

6. The display device according to claim 1, comprising at least one resin layer that covers a side surface of the first plate-shaped object.

7. The display device according to claim 1, wherein a mass ratio between the first plate-shaped object and the display module is from 1:10 to 10:1.

8. A television device comprising the display device according to claim 1.

* * * * *